United States Patent [19] [11] 4,146,585
Ward et al. [45] Mar. 27, 1979

[54] PROCESS FOR PREPARING SILANE GRAFTED POLYMERS

[75] Inventors: Robert J. Ward, Somerville; Richard J. Burns, Piscataway, both of N.J.

[73] Assignee: Union Carbide Corporation, New York, N.Y.

[21] Appl. No.: 773,775

[22] Filed: Mar. 2, 1977

[51] Int. Cl.² .................. C08L 43/04; C08F 259/04; C08F 263/02

[52] U.S. Cl. ................................ 260/827; 156/329; 260/32.8 R; 526/279; 526/320

[58] Field of Search ........................................ 260/827

[56] References Cited

U.S. PATENT DOCUMENTS

| | | | |
|---|---|---|---|
| 3,306,800 | 2/1967 | Plueddemann | 260/824 |
| 3,706,697 | 12/1972 | Backderf | 260/827 |
| 3,804,919 | 4/1974 | Scrage et al. | 260/827 |
| 3,821,174 | 6/1974 | Buning | 260/827 |
| 3,951,893 | 4/1976 | Gander | 260/827 |

OTHER PUBLICATIONS

Nakajima, Adv. in Chem. Series #125, ACS Wash. D.C. 1973, pp. 98-107.
Billmeyer, JPC PTC #8, pp. 161-178 (1965).

Primary Examiner—Herbert J. Lilling
Attorney, Agent, or Firm—Francis M. Fazio

[57] ABSTRACT

Novel compounds comprising organic copolymer or terpolymer backbones having pendent hydrolyzable organosilicon groups bonded thereto, are disclosed. Treatment of inorganic oxide surfaces with the novel compounds renders them adherent to and/or compatible with resinous media.

5 Claims, No Drawings

PROCESS FOR PREPARING SILANE GRAFTED POLYMERS

Organosilicon compounds have been employed for some time in the treatment of inorganic oxide surfaces, such as inorganic oxide films, particulate fillers and pigments, and fibers (such as glass fibers, steel fibers and aluminum fibers). Aluminum and steel fibers are regarded to be oxide surfaces because they are oxidized even though their subsurfaces are not. The typical organosilicon treatment involves coating such a surface with a hydrolyzate (and/or condensate of the hydrolyzate) of an organofunctional hydrolyzable silane. As a rule, the treatment enhances bonding between the inorganic oxide surface and resinous media and, consequently, has utility as a primer treatment in the application of coatings, adhesives or sealants to inorganic oxide surfaces and as a filler pretreatment to improve the strength and structural integrity of filled resin composites such as glass fiber reinforced plastics. Such organofunctional hydrolyzable silanes are termed "Coupling Agents" or "Adhesion Promoters."

In addition to the improvement of bonding, coupling agents have found other uses related to their ability to alter the surface characteristics of inorganic oxides, such as their application to glass fibers as a size during processing and their use as dispersing aids for inorganic oxide pigments (e.g., titanium dioxide).

Another conventional technique for supplying the coupling agent to the inorganic oxide surface is by the integral blending technique. This technique involves adding to the resin medium the desired amount of the coupling agent and providing the medium in contact with the inorganic oxide surface by supplying the latter as a particulate filler or fiber to the medium or supplying the medium with the coupling agent to a continuous surface of the inorganic oxide in the form of a film, fabric, foil or other shapes, wherein the coupling agent migrates within the medium to contact the inorganic oxide surface or surfaces, react thereat and couple with the medium under the molding, curing and other shaping conditions.

The organofunctional hydrolyzable silane contains at least one, and as many as three, hydrolyzable groups, each of which is bonded to a silicon atom. Typical hydrolyzable groups include alkoxy of 1 to about 4 carbon atoms, alkoxyalkoxy containing up to about 6 carbon atoms, halogen such as chlorine, fluorine and bromine, acryloxy of 2 to about 4 carbon atoms, phenoxy and oxime. The preferred hydrolyzable groups are alkoxy, alkoxyalkoxy and acryloxy. Common organofunctional groups are bonded to the silicon by a carbon to silicon bond. The typical commercial functional radicals present in the organofunctional groups are vinyl, methacryloxy, primary amino, beta-aminoethylamino, glycidyl, epoxycyclohexyl, mercapto, polysulfide, ureido and polyazamide. The organofunctional groups are usually quite small in relation to the molecules of the resin medium.

The coupling agent is typically supplied to the surface of the inorganic oxide as a hydrolyzate in the presence of a hydrolyzing agent such as dilute acetic acid or sodium hydroxide solution. The coupling agent molecules are subsequently bonded to the inorganic oxide surface through siloxy moieties ($\equiv$Si—O—) by condensation of the silanol groups of the coupling agent and hydroxyl groups of the inorganic oxide. Additionally, the silicon atoms of individual coupling agent molecules may become bonded to each other through oxy moieties (—O—) by a similar process of hydrolysis and condensation. It is not necessary to supply a hydrolyzing agent to the inorganic oxide surface if sufficient ambient moisture is present at the inorganic oxide surface to effect hydrolysis of the hydrolyzable groups. The coupling agent becomes bonded to the resinous medium through a chemical reaction between the reactive organofunctional group of the coupling agent and the complementarily reactive groups in the medium.

Those skilled in the art are fully aware that there are problems associated with the use of the coupling agents known in the prior art. For example, the bonds between the coupling agent and the inorganic oxide surface can be disrupted by hydrolysis in the presence of water, thus reducing wet strength of the bonds. This problem is compounded when one wishes to employ the coupling agent in a non-reactive resin medium, in that only minimal bonding, primarily of an associative or van der Waals type, can be achieved between the medium and the coupling agent. This limits the effectiveness of the coupling agents in bonding inorganic oxide surfaces to many commercially important classes of non-reactive resins. The wet strength of resin/inorganic oxide composites using coupling agents of the prior art is particularly poor when the coupling agent is used with a non-reactive resin medium. This may be due, at least in part, to the displacement of the coupling agent molecules from the inorganic oxide surface under hydrolysis conditions, wherein the bonds between the coupling agent and inorganic oxide surface and the bonds between the silicon atoms of individual coupling agent molecules are disrupted by hydrolysis and the weak associative bond between the resin medium and the coupling agent is insufficient to prevent displacement of the coupling agent. Moreover, bonding between the resin medium and the organic moiety of the coupling agent occurs substantially at the interface, thus creating a boundary layer along which cleavage can occur.

SUMMARY OF THE INVENTION

There is described herein a polymeric organosilicon compound which is a substantially non-reactive polymeric organo backbone having numerous pendent organosilicon groups bonded thereto which contain hydrolyzable groups. This organosilicon compound should not be classically termed a coupling agent, yet it is used in much the same manner as coupling agents to enhance bonding between inorganic oxide surfaces and resinous media. Unlike the coupling agents of the prior art, however, the compounds of this invention can be used with equally good results in non-reactive and reactive resinous media. Further, resin/inorganic oxide composites produced using the compounds of this invention to enhance adhesion have excellent wet strength. Throughout this specification the compounds of the present invention will be referred to by the generic term "polymeric adhesion promoters."

In addition to promoting adhesion between a resin medium and an inorganic oxide surface, the polymeric adhesion promoters of this invention have been found to be useful as dispersing aids for particulate inorganic oxide materials, particularly pigments. Pigments which have been treated with the polymeric adhesion promoter can be employed in coatings, paints and the like without danger of pigment agglomeration and attendant loss of gloss or color quality.

DESCRIPTION OF THE INVENTION

The polymeric adhesion promoters of this invention comprise copolymers or terpolymers of (i) vinyl chloride, (ii) hydroxyalkyl acrylate, and, optionally, (iii) a polymerizable monomer chosen from alkyl (1-8 carbon) esters of alpha, beta-ethylenically unsaturated carboxylic acids such as acrylic, methacrylic, maleic, fumaric, itaconic and the like; or vinyl esters of saturated fatty acids of 1-6 carbon atoms such as vinyl acetate, vinyl propionate, and the like; said copolymers or terpolymers having grafted thereto organofunctional hydrolyzable silanes. The polymer chain comprises:

(a) from 25 to 60 weight percent, preferably from 40 to 55 weight percent, units derived from the vinyl chloride monomer;

(b) from 0 to 30 weight percent units derived from the polymerizable monomer chosen from alkyl esters of alpha, beta ethylenically unsaturated carboxylic acids and vinyl esters of saturated fatty acids of 1-6 carbon atoms; and (c) from 10 to 75 weight percent, preferably from 30 to 55 weight percent, units of the formula

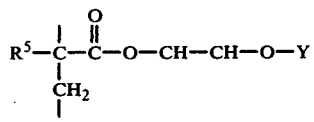  (I)

wherein $R^1$, $R^2$, and $R^5$, individually, are each hydrogen or methyl, and Y is hydrogen or

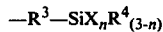  (II)

wherein X is a hydrolyzable group, as defined more fully hereinafter; $R^4$ is hydrogen or alkyl having up to 4 carbon atoms; n is an integer having a value from 1 to 3 and is preferably 3; $R^3$ is a divalent organic radical which is either oxygen or carbon bonded to the silicon atom; and a sufficient number of units defined by formula (I) have Y substituents as defined in formula (II) that the compound contains from about 0.7 to about 6.0 weight percent silicon, based on the total weight of the compound. In formula (II), X can be any of the hydrolyzable groups previously mentioned as being useful hydrolyzable groups in coupling agents of the prior art, the preferred hydrolyzable groups being alkoxy of 1 to 4 carbon atoms.

The polymeric adhesion promoter of this invention can have a weight average molecular weight from about 1,000 to about 100,000 and preferably has a weight average molecular weight of from 5,000 to 20,000.

$R^3$ can be any divalent organic radical which effectively joins the remainder of the molecule to the silicon atom. In essence, $R^3$ is an inert moiety to the invention because the invention serves the function which contemplates two components joined together into one molecule. The first component constitutes a plurality of hydrolyzable groups, each characterized by the moiety —$SiX_nR^4_{(3-n)}$ and the second component is the copolymer or terpolymer backbone. Thus, $R^3$ can be any of a broad range of divalent organic groups which can form stable bridges between the said components.

Illustrative of suitable $R^3$ substituents one can list the following:

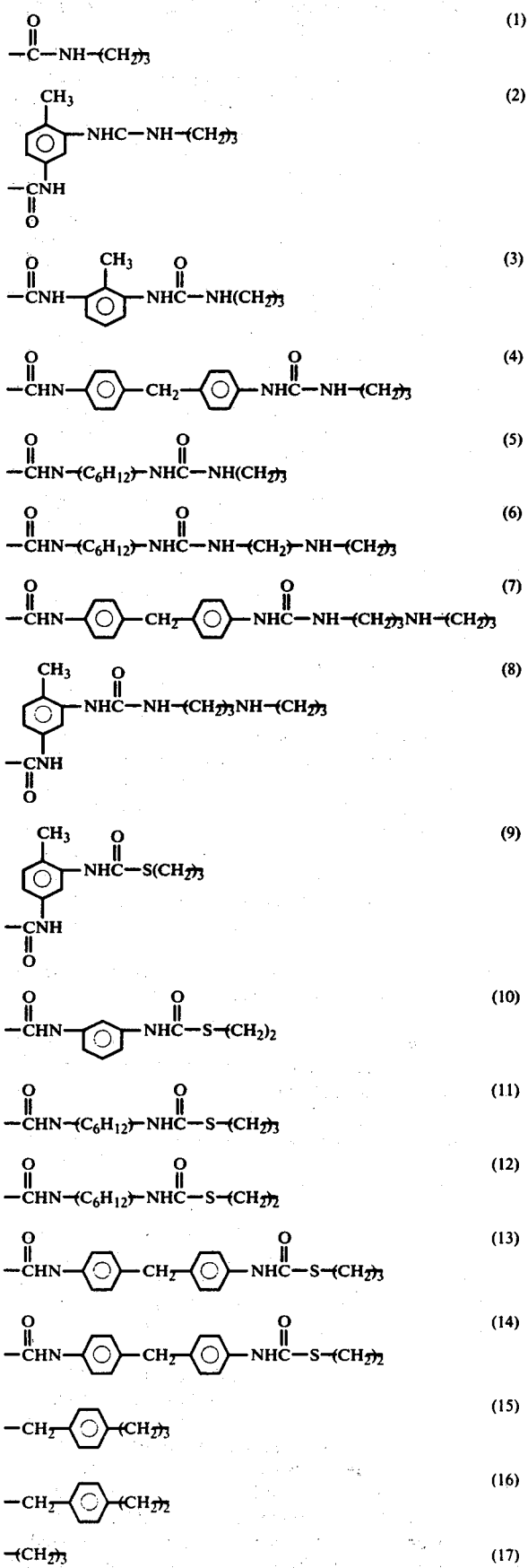

-continued

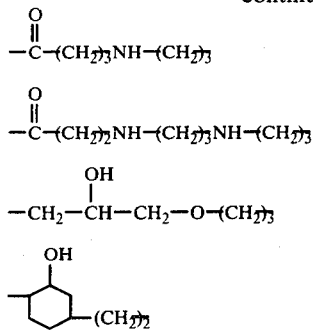

The above listing of suitable $R^3$ substituents is intended to be illustrative only and is not to be construed as limiting the scope of $R^3$ substituents. The full scope and chemical nature of suitable $R^3$ substituents is more readily understood and appreciated when one considers the methods by which the compounds of this invention can be produced.

The compounds of this invention are conveniently produced by grafting reactive organofunctional silanes containing hydrolyzable groups onto uniformly random hydroxyl-functional copolymers or terpolymers of (i) vinyl chloride; (ii) hydroxyalkyl acrylate having 2 to 4 carbons in the alkyl segment; and, optionally, (iii) a polymerizable monomer chosen from alkyl (1-8 carbon) esters of polymerizable alpha, beta-ethylenically unsaturated acids such as acrylic, methacrylic, maleic, fumaric, itaconic and the like, and vinyl esters of saturated fatty acids of 1-6 carbon atoms, such as vinyl acetate, vinyl propionate and the like. Suitable hydroxyl-functional copolymers and terpolymers are described in U.S. Pat. Nos. 3,884,887 and 3,755,271, the disclosures of which are incorporated herein by reference. While all of the hydroxyl functional copolymers or terpolymers described in those two patents are suitable precursors for the polymeric adhesion promoters of this invention, nothing disclosed therein, including the particular proportions of mer units or molecular weights described, is to be construed as a limitation on the compounds of this invention. The hydroxylfunctional copolymers and terpolymers described in U.S. Pat. No. 3,884,887 are the preferred precursors because they produce polymeric adhesion promoters having a high density of hydrolyzable groups along the backbone, and hence are highly effective in promoting bonding between the resin and inorganic oxide surface.

The grafting of the reactive organofunctional silane occurs at the hydroxyl groups of the hydroxyl-functional copolymer or terpolymer. Grafting can be effected by a direct reaction wherein the reactive group of the reactive organofunctional silane is one which is coreactive with the hydroxyl group. For example, an isocyanato-functional silane such as gamma-isocyanato-propyltriethoxysilane can be reacted with the hydroxyl-functional copolymer or terpolymer to produce a polymeric adhesion promoter having a urethane-containing $R^3$ segment such as illustrated by formula (1) above. The urethane producing reaction and conditions under which it proceeds will be well understood by those skilled in the art. The reaction is usually carried out in the presence of a suitable urethane catalyst. Illustrative of suitable catalysts one can mention the stannous salts of carboxylic acids such as stannous octoate, stannous oleate, stannous acetate and stannous laurate; dialkyltin dicarboxylates such as dibutyltin diluarate, dibutyltin diacetate, dilauryltin diacetate, dibutyltin di(2-ethylhexanoate); dialkyltin oxides; trialkyltin oxides, tertiary amines; and tin mercaptides such as di-n-octyltin mercaptide. Other suitable catalysts will be known to those skilled in the art. The catalyst is generally employed at a concentration of from 0.01% to 10%, preferably from 0.01% to 1%, based on the weight of the reactants. The reaction proceeds satisfactorily at a temperature of from 1° C. to 150° C., and is preferably carried out at from room temperature to 100° C. When the reaction is to be carried out at a temperature greater than 40° C., a suitable heat stabilizer should be present to prevent thermal degradation of the hydroxyl-functional polymer. Those skilled in the art will know the stabilizers which are suitable, and some, such as the organotin mercaptides, can serve both the function of heat stabilizer and catalyst in the reaction.

While the reaction can be carried out in the absence of solvent by maintaining the hydroxylfunctional copolymer or terpolymer in the melt stage during the reaction, it is preferred to employ a solvent in which the hydroxyl-functional copolymer or terpolymer is soluble and which is inert to the reactants. Those skilled in the art will recognize which solvents are suitable, however, one can mention as being merely illustrative thereof acetone, methyl ethyl ketone, methyl isobutyl ketone, diisobutylketone, 2-ethyoxyethyl acetate, 2-methoxyethyl acetate, tetrahydrofuran, 2-ethylhexyl acetate, cyclohexanone and 2-nitropropane. The solvent can be employed at a concentration of up to 95 weight percent, preferably from 50 weight percent to 90 weight percent. The reaction time can vary from a few hours to a month, depending on catalysis, temperature, etc. Typically, the reaction was carried to completion in 4 to 5 hours using 1% of an organotin mercaptide catalyst at a reaction temperature of about 56° C. Because of their ready availability and the ease and rapidity with which they can be reacted with the hydroxyl functional copolymer or terpolymer, it is preferred to employ isocyanato-silanes in producing the compounds of this invention, gamma-isocyanatopropyltriethyoxysilane being most preferred.

Alternatively, the polymeric adhesion promoters of this invention can be produced by the direct reaction of the hydroxyl-functional copolymer or terpolymer with an organofunctional silane having a reactive group, other than an isocyanato group, which is coreactive with the hydroxyl group, such as halo or oxirane. For example, β-chloromethylphenylpropyltriethoxysilane can be reacted with the hydroxyl-functional copolymer or terpolymer to produce a polymeric adhesion promoter having as its $R^3$ substituent the moiety illustrated in formula (15). Those skilled in the art will know the conditions under which such reactions will proceed. The reaction can be carried out in any of the solvents previously mentioned as being suitable for the reaction of the isocyanato silane with the hydroxyl-functional copolymer or terpolymer. Similarly, chloropropyltriethoxysilane can be reacted with the hydroxyl-functional copolymer or terpolymer to produce a polymeric adhesion promoter of this invention having an $R^3$ substituent as illustrated by formula (17).

Illustrative of yet another method of grafting the organofunctional silane groups to the polymer backbone by direct reaction is the reaction of an oxirane-functional organosilane such as glycidoxypropyltrimethoxysilane or beta-(3,4-epoxycyclohexyl)ethyltrimethoxysilane with the hydroxyl-functional copolymer or terpolymer, resulting in the formation of an $R^3$ substituent as illustrated in formulas (20) and (21), respectively. The reaction between the oxirane group and the hydroxyl group is one which will be immediately understood by those skilled in the art and they will know the conditions under which such reactions proceed without further elaboration herein. Generally, the reaction can be carried out at room temperature or higher using a tertiary amine catalyst or at elevated temperatures on the order of about 350° F. without catalysis. The latter procedure prevents degradation of the vinyl chloride mer units which can be caused by the presence of tertiary amines.

Other methods of grafting organofunctional silane groups onto the polymer backbone involve first reacting a difunctional organic compound with the hydroxyl-functional copolymer or terpolymer (or with a reactive organofunctional silane containing silicon-bonded hydrolyzable groups thereon) to form a monofunctional intermediate which is subsequently reacted with the reactive organofunctional silane (or the hydroxyl-functional copolymer or terpolymer). The difunctional organic compound can be any one in which at least one of the functional groups is coreactive with the hydroxyl groups of the copolymer or terpolymer, at least one of the functional groups is coreactive with the organofunctional group of the reactive organofunctional silane, and the remaining segement is an essentially inert moiety. For purposes of defining the difunctional organic compound, an ethylenically unsaturated site capable of undergoing reaction with the organofunctional group of the reactive organofunctional silane is considered a functional group. Typically, the difunctional organic compound is an organic diisocyanate, such as tolylene diisocyanate, hexamethylene diisocyanate, p,p'-diphenylmethane diisocyanate and the like. By employing an organic diisocyanate in this manner a number of reactive organofunctional silanes which are widely commercially available, but which are not directly coreactive with the hydroxyl-functional copolymer or terpolymer, can thereby be conveniently grafted to the copolymer or terpolymer backbone. For example, the organic diisocyanate can be reacted with a primary amino-silane (e.g., gamma-aminopropyltriethoxysilane or N-beta-(aminoethyl)-gamma-aminopropyl trimethoxysilane) to produce an isocyanato-silane which contains a urea

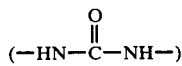

segment and the isocyanato-silane thus produced is subsequently reacted with the hydroxyl functional copolymer or terpolymer.

Typical $R^3$ groups which are produced by the foregoing reaction sequence are illustrated by formulas (2) through (8). Alternatively, the organic diisocyanate can first be reacted with a mercaptosilane (e.g., gamma-mercaptopropyltrimethoxysilane) to produce an isocyanato-functional organosilane containing the segment

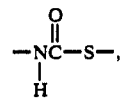

which is subsequently reacted with the hydroxyl-functional copolymer or terpolymer. Typical $R^3$ groups which are thus produced are illustrated by formulas (9) through (14).

Other difunctional organic compounds which are useful in producing the polymeric adhesion promoters of this invention include the halide salts of alpha, beta-unsaturated carboxylic acids, such as acryloyl chloride. The halide salt is first reacted with the hydroxyl functional copolymer or terpolymer, resulting in esterification of the hydroxyl groups and the production of HCl as a byproduct. The esterified copolymer or terpolymer is subsequently reacted with a reactive organofunctional silane wherein the organofunctional group contains a labile hydrogen atom, such as an amino-silane, in the presence of sodium amide or sodium alkoxide. The labile hydrogen atom of the reactive organofunctional group adds across the ethylenically unsaturated bond in a Michael condensation, resulting in $R^3$ groups of the type illustrated by formulas (18) and (19).

All the foregoing methods of producing the polymeric adhesion promoters of this invention are described for purposes of illustration only and are not intended to limit the scope of the invention in any way. It will be apparent to one skilled in the art from the foregoing discussion that many possible molecular structures are contemplated within the scope of the polymeric adhesion promoters of this invention, and particularly as the $R^3$ substituent thereof, and that the individual structures are too numerous to list herein.

It is to be understood that, in producing the polymeric adhesion promoters of this invention, it is not necessary, although it is usually desirable, that all the hydroxyl groups of the hydroxyl-functional copolymer or terpolymer be reacted; that is, there can be residual hydroxyl groups present in the polymeric adhesion promoter, provided that sufficient hydroxyl groups are substituted to provide the aforesaid concentration of silicon in the polymeric adhesion promoter.

The inorganic oxide which can be beneficially treated by the polymeric adhesion promoters defined above is any inorganic solid material which possesses either oxygen (chemisorbed or covalently bonded) or hydroxyl (bonded or free) at is exposed surface, and includes any material which can be treated by coupling agents known in the prior art. The inorganic oxide material can be in any form, including particles of irregular or regular (e.g., spherical) shape, individual fibers, woven fiber mats or fabric, or continuous surfaces such as sheets, films, slabs, and formed shapes. Specific illustrations of suitably employed inorganic oxide materials are, for example, brass (with an oxidized surface), copper metal (oxidized at its surface), aluminum metal (oxidized at its surface), iron or steel (oxidized at its surface), alumina, aluminum trihydrate, siliceous materials such as fumed silica, hydrated silica (precipitated silica), silica aerogels, silica xerogels, aluminum silicates, calcium magnesium silicate, asbestos, glass fibers, clays, molecular sieves, Wallostonite, calcium carbonate, carbon black (including lamp black), titanium dioxide (including titanium dioxide which contains HCl soluble alumina and/or silica), calcium sulphate, magnesium sulfate, calcium carbonate containing a silica coating or agglomerated to silica, and the like.

The polymeric adhesion promoters of this invention can be used in essentially the same manner as coupling agents known in the prior art, although the mechanism by which they function is not the same. The polymeric adhesion promoter can be supplied to the surface of the inorganic oxide material as a hydrolyzate or partial condensate of the hydrolyzate prior to contacting the inorganic oxide material with the resinous medium or the polymeric adhesion promoter can be blended into the resinous medium and the resinous medium thereafter brought into contact with the inorganic oxide under hydrolysis conditions (i.e., integral blending). Where it is desired to use the polymeric adhesion promoter to improve adhesion between the resin and a continuous surface of inorganic oxide, such as a sheet of inorganic oxide material, the polymeric adhesion promoter can be applied as a primer coating to the surface in the form of a solution by any suitable means such as brushing or spraying.

Additionally, any other means known in the prior art for applying coupling agents to inorganic oxide surfaces can be employed to apply the polymeric adhesion promoters of this invention to inorganic oxide surfaces.

The hydrolysis and subsequent condensation or partial condensation which causes bonding of the polymeric adhesion promoter to the inorganic oxide surface is brought about under the same conditions as is the bonding of conventional silane coupling agents to inorganic oxide surfaces. Those skilled in the art are aware that ambient moisture at the inorganic oxide surface is usually sufficient to effect the bonding, however, water can be provided to the surface to facilitate hydrolysis and in some cases it has been found beneficial to provide to the surface as a hydrolyzing agent a dilute acid or base solution such as dilute acetic acid or NaOH in water.

The resinous material can be a thermoplastic or thermosetting material, and the use of the term "resinous material" does not exclude the possibility that the material is formed in situ and therefore is derived from a monomeric material while in contact with an inorganic oxide material.

The resin medium with which the polymeric adhesion promoters of this invention can be suitably employed includes essentially any plastic or resin. Included in the definition of plastic are rubber compounds. Suitable plastics and resins include, by way of example, thermoplastic and thermosetting resins and rubber compounds (including thermoplastic elastomers). The plastics and resins, in conjunction with the inorganic oxide materials treated with the polymeric adhesion promoters of this invention, can be employed, for example, for molding (including extrusion, injection, calendering, casting, compression, lamination, and/or transfer molding), coating (including laquers, film bonding coatings and painting), inks, dyes, tints, impregnations, adhesives, caulks, sealants, rubber goods, and cellular products. Thus the choice and use of the plastics and resins with treated inorganic oxide materials is essentially limitless. For simple illustration purposes, the plastics and resins may be alkyd resins, oil modified alkyd resins, unsaturated polyesters as employed in GRP applications, natural oils, (e.g., linseed, tung, soybean), epoxides, nylons, thermoplastic polyester (e.g., polyethylene-terephthalate, polybutyleneterephthalate), polycarbonates, polyethylenes, polybutylenes, polystyrenes, styrene butadiene copolymers, polypropylenes, ethylene propylene co- and terpolymers, silicone resins and rubbers, SBR rubbers, nitrile rubbers, natural rubbers, acrylics (homopolymer and copolymers of acrylic acid, acrylates, methacrylates, acrylamides, their salts, hydrohalides, etc.,), phenolic resins, polyoxymethylene (homopolymers and copolymers), polyurethanes, polysulfones, polysulfide rubbers, nitrocelluloses, vinyl butyrates, vinyls (vinyl chloride and/or vinyl acetate containing polymers), ethyl cellulose, the cellulose acetates and butyrates, viscose rayon, shellac, waxes, ethylene copolymers (e.g., ethylene-vinyl acetate copolymers, ethylene-acrylic acid copolymers, ethylene-acrylate copolymers), and the like.

If desired, the polymeric adhesion promoters of this invention can be employed in combination with any of the coupling agents known in the prior art.

Generally, the polymeric adhesion promoters of this invention serve the dual function of enhancing bonding between the resinous medium and inorganic oxide surface and of rendering the inorganic oxide surface more compatible with the resinous medium. The latter function increases wettability and dispersibility of particulate or fibrous fillers, pigments and the like in the resinous medium. The former function renders the polymeric adhesion promoters particularly useful in improving the bonding of coatings and adhesives to inorganic oxide substrates.

The amount of polymeric adhesion promoter used is that amount which alters the surface characteristics of the inorganic oxide surfaces so that they are more compatible with and/or adherent to the resinous medium within which they are incorporated. When the polymeric adhesion promoter is supplied to the resin by the integral blending technique, the effective amount of polymeric adhesion promoter can vary from about 0.1 weight percent to about 10 weight percent, and is preferably from 0.5 weight percent to 2.0 weight percent, based on the weight of resin. When the polymeric adhesion promoter is supplied directly to the surface of the inorganic oxide material in the form of a fibrous or particulate filler, pigment or the like the effective amount can vary from about 0.1 weight percent to about 10 weight percent, and is preferably from 0.5 weight percent to 5.0 weight percent, based on the weight of the inorganic oxide material. When applying a solution of the polymeric adhesion promoter as a primer to a surface of inorganic oxide, the effective amount of polymeric adhesion promoter applied to the surface can vary from about 0.05 grams/m$^2$ to about 1.5 grams/m$^2$, and is preferably from 0.3 grams/m$^2$ to 0.7 grams/m$^2$, calculated as the weight of polymeric adhesion promoter (exclusive of solvent), per square meter of inorganic oxide surface treated.

While not wishing to be bound by any particular theory of the mechanism involved, we believe that the advantages of the polymeric adhesion promoters of this invention, by comparison with the non-polymeric coupling agents and adhesion promoters known in the prior art, result chiefly from the nature of the bonding between the resin medium and the polymeric adhesion promoter. The polymer backbone of the polymeric adhesion promoter effects bonding with the resin by extensive molecular entanglement therewith and, to a certain extent, by associative or Van der Waals bonding. This bonding prevents displacement of the silicon atoms from the inorganic oxide surface under hydrolysis conditions, regardless of the nature of the resin medium (i.e., reactive or non-reactive). It is now believed that, in the presence of moisture, ≡Si—O—Si≡ bonds at the inorganic oxide surface undergo frequent hydrolysis and recondensation; that is, the bond is in a fluctuating state of being broken and reformed. Unlike the coupling agents of the prior art, the polymeric adhesion promoters of our invention have numerous silicon atoms at the inorganic oxide surface bonded to each other through the polymeric backbone, and thus to the resin medium, so that even in the presence of moisture each polymeric adhesion promoter molecule will maintain a certain number of bonds to the inorganic oxide surface at all times as the individual ≡Si—O—Si≡ bonds are hydrolyzed and recondensed. Moreover, the molecular entanglement between the polymer backbone of the polymeric adhesion promoter and the resin medium extends into the resin medium well beyond the interface between the polymeric adhesion promoter and the resin medium. By comparison, conventional coupling agents, with relatively small organo moieties, bond to the resin primarily at the interface, thus creating a boundary layer of bonds along which cleavage may occur.

The following examples are presented to further illustrate the invention described herein and are not to be construed as limiting the scope of the invention. Unless otherwise specified all percents are by weight.

For the sake of brevity in the examples, the designations in the first column of Table I will be used in lieu of the complete description given in the second column.

Table I

| Designation | Composition |
|---|---|
| Hydroxyl-functional polymer A | A uniformly random terpolymer of 80% vinyl chloride mer units, 5% vinyl acetate mer units and 15% hydroxypropyl acrylate mer units. Inherent viscosity is 0.3. |
| Hydroxyl-functional polymer B | A uniformly random terpolymer of 58% vinyl chloride mer units, 34% vinyl acetate mer units and 8% hydroxypropylacrylate mer units. Viscosity is 1,500 cps (40% resin in isopropyl acetate). |
| TM Estane 5711 | A thermoplastic polyurethane resin supplied by B.F. Goodrich Co. |
| Qthane® PA-30 | A thermoplastic polyurethane resin supplied by K.J. Quinn. Inc. |
| EVA 505 | Ethylene/vinyl acetate copolymer containing 28% vinyl acetate mer units and having an inherent viscosity of 0.81. |
| VAGD | A uniformly random terpolymer of 91% vinyl chloride mer units, 3% vinyl acetate mer units and 4% vinyl alcohol mer units. Viscosity is 35 cps (20% resin in methyl ethyl ketone). |
| Stabilite® Ester-10 | Glycerol ester of hydrogenated rosin, having a softening point of 83° C. Supplied by Hercules, Inc. |
| VYHH | A uniformly random copolymer of 86% vinyl chloride mer units and 14% vinyl acetate mer units. Viscosity is 50 cps (20% resin in methyl ethyl ketone). |
| VMCC | A uniformly random terpolymer of 83% vinyl chloride mer units, 16% vinyl acetate mer units and 1% interpolymerized dibasic acid (0.7–0.8 carboxyl). Viscosity is 20 cps (20% resin in methyl ethyl ketone). |

EXAMPLE 1

A 25% solids solution of hydroxyl-functional polymer A in acetone was dried by placing it in a container with 3-A Linde Molecular sieves and rolling on a jar mill overnight. To a dry container there were charged 500 grams of the dried solution, 30 grams of gamma-isocyanatopropyltriethoxysilane and 0.159 grams of dibutyltin dilaurate. A portion of the mixture was sealed as a sample for infrared spectroscopic monitoring of the isocyanate band and the remaining portion was sealed in a container with no air space. After 25 days, the isocyanate band had disappeared, indicating complete reaction of the gamma-isocyanatopropyltrimethoxysilane with the hydroxyl-functional polymer to produce a polymeric adhesion promoter. The polymeric adhesion promoter was admixed with a 20% solids solution of VYHH resin in acetone at a concentration of 2% polymeric adhesion promoter (solids), based on the weight of VYHH resin (solids). Using a ⅜in. NC threaded rod, two coats of resin containing the polymeric adhesion promoter were applied to a strip of canvas and, using a No. 70 wire wound rod, one coat of resin containing the polymeric adhesion promoter was applied to an aluminum surface. The coated canvas was applied to the coated aluminum surface using a hand roller. Two canvas/aluminum laminates were thus prepared and each was steamed for 1 hour to induce rapid hydrolysis of the polymeric adhesion promoter at the aluminum surface and subsequently heated in an oven at 105° C. for 1 hour to cause condensation. One laminate was then aged 3 weeks at ambient conditions and another was aged 3 weeks under water. Each sample was tested for 180° peel strength (at 2 in./min.) and the results appear in Table II below. The wet sample was not dried prior to testing. Two additional sets of samples of canvas/aluminum laminates were prepared and tested in a similar manner, with the exception that there were substituted for the VYHH resin Estane TM 5711 (20% in acetone) and Qthane® PA-30 (20% in acetone), respectively, at the same concentrations. As controls, canvas/aluminum laminates were prepared and tested in a similar manner using no resin additive, using various monomeric silane coupling agents in place of the polymeric adhesion promoter at a 2% concentration, using an unreacted blend of hydroxyl functional polymer A and gamma-isocyanatopropyltriethoxysilane in place of the polymeric adhesion promoter at a 2% concentration, and using hydroxyl functional polymer A in place of the polymeric adhesion promoter at a 2% concentration.

Table II

| | | Canvas to Aluminum Peel Strength, (lb./in.) | | |
|---|---|---|---|---|
| Additive (2%) | Aging Method | VYHH | TM Estane 5711 | Qthane® PA-30 |
| Polymeric adhesion promoter | Dry | 23* | 28 | 15 |
| | Wet | 18* | 25 | 14 |
| None | Dry | 1 | 8 | 2 |
| | Wet | 1 | 2 | 0.2 |
| A | Dry | 0 | 6 | 8 |
| | Wet | 0 | 6 | 2 |
| B | Dry | 0 | — | — |
| | Wet | 0 | — | 2.5 |
| C | Dry | 0 | — | — |
| | Wet | 0 | — | — |
| D | Dry | 20 | — | 9 |
| | Wet | 0.2 | — | 5 |
| E | Dry | 5 | — | 6 |

Table II-continued

| Additive (2%) | Aging Method | Canvas to Aluminum Peel Strength, (lb./in.) | | |
|---|---|---|---|---|
| | | VYHH | TM Estane 5711 | Qthane® PA-30 |
| | Wet | 0 | — | 1 |

*Failure at canvas surface. All others failed at aluminum surface.
A = gamma-isocyantopropyltriethoxysilane
B = gamma-glycidoxypropyltrimethoxysilane
C = gamma-mercaptopropyltrimethoxysilane
D = Unreacted blend of gamma-isocyantopropyltriethoxysilane and hydroxyl-functional polymer A
E = hydroxyl-functional polymer A

EXAMPLE 2

The polymeric adhesion promoter produced in Example 1 was added to portions of VYHH and Estane TM 5711 resins in varying concentrations from 0% to 10% (based on solids). Each of the portions of resin containing the polymeric adhesion promoter was used as an adhesive to bond canvas to aluminum by the same procedure used in Example 1. All the canvas/aluminum laminates of this example were aged 3 weeks under water and tested for 180° peel strength while still wet. The results appear in Table III. Weight percent silicon was calculated on the basis of the total weight of the resin and polymeric adhesion promoter, exclusive of solvents. It can be seen that the polymeric adhesion promoters of this invention provide improved resin to aluminum adhesion at concentrations as low as 0.2%.

Table III

| Polymeric Adhesion Promoter, Wt. % | % Si | Canvas to Aluminum Peel Strength (Wet), (lb./in.) | |
|---|---|---|---|
| | | VYHH | Estane 5711 |
| 0 | 0 | 1.0 | 0 |
| 0.2 | 0.005 | 1.7 | 18 |
| 0.5 | 0.0125 | 3.5 | 23 |
| 1.0 | 0.05 | 18* | 25 |
| 10.0 | 0.25 | 22* | 23 |

*Failure at canvas interface. All others failed at aluminum surface.

EXAMPLE 3

A portion of hydroxyl-functional polymer B was dried by placing it in a container with Linde 3-A molecular sieves and rolling on a jar mill. To a 40% solids solution of the dried hydroxyl-functional polymer in isopropyl acetate there were added 2.675 grams of gamma-isocyanatopropyltriethoxysilane. The reactants were sealed in a container with no air space and allowed to react for 1 week to produce a polymeric adhesion promoter. The polymeric adhesion promoter was admixed with a 20% solids solution of Estane TM -5711 resin at a concentration of 2% polymeric adhesion promoter (based on total solids). The resin containing the polymeric adhesion promoter was used as an adhesive to bond canvas to aluminum by the same procedure used in Example 1. One canvas/aluminum laminate was aged 3 weeks at ambient conditions, after which it had a 180° peel strength of 48 lb./in. Another canvas/aluminum laminate was aged 3 weeks under water, after which it had a 180° peel strength of 23 lb./in.

EXAMPLE 4

There were charged to a jar 47.66 grams of gamma-mercaptopropyltrimethoxysilane, 63.4 grams of acetone, 15.66 grams of tolylene diisocyanate and 1 drop (300 ppm) of an organotin catalyst, M&T Chemicals, Inc.'s T-12. The contents of the jar were allowed to react for 3 weeks at room temperature, after which infrared spectroscopic analysis indicated that half the isocyanato groups (i.e., —N=C=O) had been reacted. To 13 grams of the reaction product were added 85 grams of a 20% solution of hydroxyl-functional polymer A in acetone and these were allowed to react at room temperature for 4 weeks to produce a polymeric adhesion promoter. The polymeric adhesion promoter was admixed with a 20% solids solution of VYHH resin in acetone at a concentration of 2% polymeric adhesion promoter, based on total solids. The resin containing the polymeric adhesion promoter was used as an adhesive to bond canvas to aluminum by the same procedure used in Example 1. One canvas/aluminum laminate was aged 3 weeks at ambient conditions, after which it had a 180° peel strength of 23 lb./in. Another canvas/aluminum laminate was aged 3 weeks under water, after which it also had a 180° peel strength of 23 lb./in.

EXAMPLE 5

To a 500-ml. four-necked flask equipped with a stirrer, thermometer, heating mantle, reflux condenser, and nitrogen purge were added 50 grams of 20% solids solution of hydroxyl-functional polymer A, which had been predried over Linde-3A molecular sieves, 3.11 grams of gamma-isocyanatopropyltriethoxysilane and 0.131 grams of a organotin mercaptide catalyst/heat stabilizer, M&T Chemicals, Inc.'s Thermolite®-31. The temperature of the reactants was raised to acetone reflux (56° C.) and degree of reaction was determined by the disappearance of the isocyanate band by infrared spectroscopy. After five hours the reaction was essentially complete. Temperature was held at 56° C. for 2 more hours and the reaction product, which was an amber colored liquid having a viscosity of about 1,000 cps. at 56° C., was discharged into a sealed container blanketed with nitrogen. After it had cooled, a portion of the polymeric adhesion promoter thus produced was admixed with a 20% solids solution of VYHH resin in acetone at a concentration of 2% polymeric adhesion promoter, based on total solids. The resin containing the polymeric adhesion promoter was used as an adhesive to bond canvas to aluminum by the method used in Example 1. One of the canvas/aluminum laminates was aged 1 week at ambient conditions, after which it had a 180° peel strength of 25 lb./in. Another canvas/aluminum laminate was aged 1 week under water, after which it also had a 180° peel strength of 25 lb./in. By comparison, canvas/aluminum laminates produced using VYHH resin (20% in acetone) containing no polymeric adhesion promoter as adhesive had 180° peel strengths of 1.5 lb./in. after 1 week of aging at ambient conditions and 0.1 lb./in. after 1 week of aging under water.

EXAMPLE 6

To determine the effect of silicon content in the polymeric adhesion promoter on bond strength, a series of three polymeric adhesion promoters of varying silicon content, identified as PAP-1, PAP-2, and PAP-3 were prepared. In each preparation, hydroxyl-functional polymer A was reacted with gamma-isocyanatopropyltriethoxysilane in the presence of an organotin mercaptide catalyst/stabilizer in a manner essentially the same as that of Example 5. PAP-1 was prepared using the reactants at an isocyanate to hydroxyl (NCO/OH) equivalent ratio of 1:1 (i.e., complete substitution of hydroxyls); PAP-2 was prepared at an NCO/OH equivalent ratio of 1:3; and PAP-3 was prepared at an NCO/OH equivalent ratio of 1:6. The silicon contents of the resulting polymeric adhesion promoters, based on total solids, were as follows: PAP-1, 2.64%; PAP-2, 0.88%; PAP-3, 0.44%. Each of the polymeric adhesion promoters were admixed with portions of a polyester-based thermoplastic polyurethane at varying concentrations to produce a series of adhesive compositions. The polyurethane was an adduct of 57.6 grams of p,p'-diphenylmethane diisocyanate, 5.82 grams of ethylene glycol, 211 grams of butanediol and 232.8 grams of a polycaprolactone polyol having an average molecular weight of 2,000 and a hydroxyl number of 56.1 mg. KOH/g., supplied as a 30% solids solution in acetone. Each of the adhesives thus produced was used to bond canvas to aluminum by a procedure similar to that used in Example 1. The canvas/aluminum laminates were aged 1 week under water and tested for 180° peel strength while wet. The results appear in Table IV. It can be seen that, for any given concentration of polymeric adhesion promoter in the adhesive, there is a direct relationship between the silicon content of the polymeric adhesion promoter and the peel strength of the bond.

Table IV

| Polymeric Adhesion | Peel Strength; (lb./in.) | | |
|---|---|---|---|
| Promoter Concentration,% | PAP-1 | PAP-2 | PAP-3 |
| 0 | 2 | 2 | 2 |
| 0.2 | 18 | 13 | 2 |
| 0.5 | 23 | 16 | 12 |
| 1.0 | 21 | 20 | 11 |
| 2.0 | 25 | 16 | 12 |

EXAMPLE 7

To a 3-liter, four-necked glass reaction kettle equipped with a stirrer, thermometer, heating mantle, Dean-Stark separator with reflux condenser, dropping funnel and nitrogen purge was added 510 grams of hydroxyl-functional polymer A and 959.6 grams of an organotin mercaptide catalyst-stabilizer, M&T Chemicals, Inc.'s Thermolite ®-31. The reactants were heated with stirring to 115° C. for 1 hour to effect solution. There was added 313.5 grams of toluene and the reactants were heated to 133° C. to remove water azeotropically. After 1 hour of refluxing, about 1 gram of water and 20 grams of solvent were removed from the Dean-Stark separator. The temperature of the kettle contents were reduced to 60° C. and 158.5 grams of gamma-isocyanatopropyltriethoxysilane were added. The reactants were reacted at 60° C. until infrared analysis indicated completion by disappearance of the isocyanate band. After the reaction product had cooled, 735 grams of anhydrous methanol and 61 grams of anhydrous 2-ethoxymethyl acetate were added to stabilize the ethoxy groups. The polymeric adhesion promoter produced by the described reaction was admixed with several different resins, at a concentration of 2% polymeric adhesion promoter (based on solids weight) to produce a series of adhesive compositions. Using a procedure similar to that in Example 1, the adhesives were employed to bond a variety of substrates. The resulting laminates were aged for 3 weeks, some at ambient conditions and some under water. The laminates were then tested for 180° peel strength. Results are presented in Table V. As controls, there are presented the peel strengths obtained for laminates which were produced using the resins without polymeric adhesion promoters as the adhesive.

Table V

| Resin | Laminate | Peel Strength (lb./in.) | |
|---|---|---|---|
| | | Dry aging | Wet aging |
| EVA-505 Stabilite[1] | Aluminum-/Aluminum | 7 | 10 |
| Ester-10 | (Control) | 0.1 | 0.1 |
| Qthane PA-30 | Canvas/Aluminum | 15 | 15 |
| | (Control) | 8 | 0.1 |
| | Canvas/Glass | 20 | 22 |
| | (Control) | 0.1 | 0 |
| | PVC[2]/Aluminum | 6 | 10 |
| | (Control) | 2 | 0.1 |
| VAGD | Canvas/Aluminum | 19 | 12 |
| | (Control) | 0.6 | 0.1 |

[1] 50/50 weight % blend
[2] Plasticized poly(vinyl chloride)

EXAMPLE 8

This example illustrates the use of the compounds of this invention in the production of structural composite materials. Glass fiber fabric (#7628, Dow Chemical Co.) was treated by dipping it in a 1% aqueous solution of a polymeric adhesion promoter of this invention. The polymeric adhesion promoter was an adduct of hydroxyl-functional polymer A and gamma-isocyanatopropyltriethoxysilane reacted at an isocyanate to hydroxyl equivalents ratio of 1:1 in a manner similar to that of Example 1. B-stage epoxy laminates were then prepared using the treated glass fiber fabric and an epoxy resin (661-80A, Dow Chemical Co.). The laminates, which were 18 ply, were pressed for 1 hour at 155° C.

Flexural strengths of several laminates thus produced were tested after 2 hours at ambient conditions (dry), after 2 hours of immersion in water, and after 72 hours of immersion in water. Additional laminates were similarly prepared and tested as controls which used untreated glass fiber fabric. The results, which appear in Table VI, indicate that the laminates prepared using the glass fibers treated with the polymeric adhesion promoter of this invention retained more of their flexural strength after immersion in water than did the controls.

Table VI

| | | Flexural Strength (psi × 10³) | | |
|---|---|---|---|---|
| | | Dry | Wet | % Retention[1] |
| Untreated | 2 hrs. | 62.1 | 37.9 | 61.0 |
| | 72 hrs. | | 27.5 | 44.2 |
| Treated | 2 hrs. | 56.8 | 48.0 | 72.9 |
| | 72 hrs. | | 28.4 | 50.0 |

[1] Wet strength as a percentage of dry strength

EXAMPLE 9

This example illustrates the use of the polymeric adhesion promoters of this invention as dispersing agents for inorganic oxide pigments in coatings and their effect on gloss and weathering properties. The polymeric adhesion promoter used in this example was an adduct of hydroxyl-functional polymer A and gamma-isocyanatopropyltriethoxysilane which were reacted at an isocyanate to hydroxyl equivalent ratio of 1:1 by a procedure similar to that employed to produce the polymeric adhesion promoter of Example 1. A series of 9 coatings pigmented with rutile titanium dioxide were prepared as formulations of the components indicated in Table VII. Coatings C-1 and C-2 are presented as controls to illustrate comparative results obtained when using lecithin, a widely used pigment dispersing agent in the prior art, as the titanium dioxide dispersing agent. Coatings C-3 and C-4 are presented as controls to illustrate comparative results obtained when using a conventional non-polymeric organosilicon coupling agent as the titanium dioxide dispersing agent. Coatings I and II and the four control coatings were prepared in the following manner. The toluene, titanium dioxide and a dispersing agent were charged to a pebble mill and milled overnight (at least 18 hours). The VMCC resin solution was added, mixed for 2 hours, and discharged. In preparing coating III, the toluene, titanium dioxide and polymeric adhesion promoter were first charged to the pebble mill and milled for 4 hours, the lecithin was then added and milling continued for about 16 hours, and the VMCC solution was finally added and milling continued for 2 hours. In preparing coating IV, the toluene, titanium dioxide and lecithin were first charged to the pebble mill and milled for 4 hours, then the polymeric adhesion promoter was added and milling continued for 16 hours, and finally the VMCC resin solution was added and milled for 4 hours. In preparing coating V, the toluene, titanium dioxide, polymeric adhesion promoter and lecithin were all charged to the pebble mill at the same time and milled overnight (at least 18 hours), and then the VMCC resin solution was added and milled for 2 hours.

Each of the coatings was thinned to a No. 4 Ford cup viscosity of 22–24 seconds by the addition of a 50/50 weight mixture of butyl acetone and toluene. Each of the coatings was sprayed onto steel Q panels in two coats to give a coating thickness of about 1 mil or slightly greater. The coatings on the panels were air dried for 7 days and initial 60° gloss readings were taken. The coated panels were then subjected to accelerated weathering for 1600 hours on an Atlas Weather-Ometer ® simulated weather tester using a cycle of 112 minutes ultraviolet light/8 minutes dark and water spray on the coated surface. Additional 60° gloss measurements were made every 400 hours. Results appear in Table VIII. Generally, the highest gloss values were obtained in the coatings which employed a combination of 5% polymeric adhesion promoter and 1% lecithin as the pigment dispersing agent, where the polymeric adhesion promoter was added prior to or concurrently with the lecithin.

Table VII

| | Coating Formulation (p.b.w.) | | | | | | | | |
|---|---|---|---|---|---|---|---|---|---|
| | C-1 | C-2 | C-3 | C-4 | I | II | III | IV | V |
| Toluene | 100 | → | → | → | → | → | → | → | → |
| $TiO_2$[1] | 100 | → | → | → | → | → | → | → | → |
| Lecithin | 1.0 | 2.0 | — | — | — | — | 1.0 | 1.0 | 1.0 |
| Polymeric adhesion promoter[2] | — | — | — | — | 8.0 | 20 | 20 | 20 | 20 |
| 2-ethylhexyl silane | — | — | 2.0 | 5.0 | — | — | — | — | — |
| VMCC resin solution[3] | 320 | → | → | → | → | → | → | → | → |

[1] R-966 rutile $TiO_2$, DuPont
[2] 25% solids solution in toluene
[3] Resin solution had the composition:

| | | (p.b.w.) |
|---|---|---|
| | VMCC | 100 |
| Diisobutyl | Ketone | 20 |
| Methylisobutyl | Ketone | 150 |
| | Toluene | 50 |

Table VIII

| Coating | Concentration of Dispersing Agent, %[1] | 60° Gloss | | | | |
|---|---|---|---|---|---|---|
| | | Initial | 400 hrs. | 800 hrs | 1200 hrs | 1600 hrs. |
| C-1 | 1 | 31 | 38 | 38 | 34 | 22 |
| C-2 | 2 | 33 | 38 | 33 | 33 | 27 |
| C-3 | 2 | 11 | 13 | 11 | 8 | 6 |
| C-4 | 5 | 15 | 19 | 14 | 12 | 11 |
| I | 2 | 7 | 9 | 8 | 6 | 5 |
| II | 5 | 38 | 41 | 38 | 22 | 16 |
| III | 5,1* | 49 | 49 | 51 | 48 | 36 |
| IV | 5,1* | 19 | 22 | 20 | 17 | 10 |
| V | 5,1* | 47 | 49 | 49 | 46 | 40 |

[1] Calculated as per cent of pigment weight, exclusive of dispersing agent solvents
*Polymeric adhesion promoter, lecithin

What is claimed is:

1. A process for producing a silane grafted copolymer or terpolymer which comprises reacting an isocyanato-functional organosilane containing from 1 to 3 silicon-bonded hydrolyzable groups with a hydroxyl-functional copolymer or terpolymer of:
   (i) vinyl chloride;
   (ii) hydroxyalkyl acrylate; and
   (iii) a polymerizable monomer chosen from alkyl esters of alpha,beta-ethylenically unsaturated carboxylic acids having from 1 to 8 carbons in the alkyl group and vinyl esters of saturated fatty acids of 1 to 6 carbons, to produce a copolymer or terpolymer containing:
     (a) from 25 to 60 weight percent vinyl chloride units polymerized therein;
     (b) from 0 to 30 weight percent units derived from the alpha,beta-ethylenically unsaturated carboxylic acids and vinyl esters of saturated fatty acids polymerized therein; and
     (c) from 10 to 75 weight percent hydroxyalkyl acrylate units polymerized therein, a sufficient number of said hydroxyalkyl acrylate units having isocyanato-functional organosilane grafted thereto such that the copolymer or terpolymer has a silicon content of from 0.7 to 6 weight percent, said copolymer or terpolymer having a weight average molecular weight of from 1,000 to 100,000.

2. A process as claimed in claim 1, wherein the relative amounts of (i), (ii), and (iii) in the copolymer or terpolymer are such that the silane grafted copolymer or terpolymer produced has from 40 to 55 weight percent vinyl chloride units polymerized therein.

3. A process as claimed in claim 1, wherein the relative amounts of (i), (ii), (iii), in the copolymer or terpolymer are such that the silane grafted copolymer or terpolymer produced has from 30 to 55 weight percent hydroxyalkyl acrylate units polymerized therein.

4. A process as claimed in claim 1, wherein the amount of isocyanato-functional organosilane which is reacted with the hydroxyl-functional copolymer or terpolymer is such that the resultant silane grafted copolymer or terpolymer has a silicon content of from 2 to 4 weight percent.

5. A process as claimed in claim 1, wherein said isocyanato-functional organosilane is gamma-isocyanatopropyltriethoxysilane.

* * * * *